United States Patent
Lin et al.

(10) Patent No.: US 11,955,397 B2
(45) Date of Patent: Apr. 9, 2024

(54) SEMICONDUCTOR STRUCTURE

(71) Applicant: Vanguard International Semiconductor Corporation, Hsinchu (TW)

(72) Inventors: Shin-Cheng Lin, Tainan (TW); Cheng-Wei Chou, Taoyuan (TW); Ting-En Hsieh, New Taipei (TW); Yi-Han Huang, Taoyuan (TW); Kwang-Ming Lin, Taichung (TW); Yung-Fong Lin, Taoyuan (TW); Cheng-Tao Chou, Huwei Township (TW); Chi-Fu Lee, Taoyuan (TW); Chia-Lin Chen, Hsinchu (TW); Shu-Wen Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 157 days.

(21) Appl. No.: 17/092,851

(22) Filed: Nov. 9, 2020

(65) Prior Publication Data
US 2022/0148938 A1    May 12, 2022

(51) Int. Cl.
*H01L 29/778* (2006.01)
*H01L 23/31* (2006.01)
(Continued)

(52) U.S. Cl.
CPC ...... *H01L 23/3192* (2013.01); *H01L 23/3171* (2013.01); *H01L 29/66462* (2013.01);
(Continued)

(58) Field of Classification Search
CPC .......... H01L 29/7786; H01L 29/7787
See application file for complete search history.

(56) References Cited

U.S. PATENT DOCUMENTS 9,722,063 B1 * 8/2017 Kudymov ........... H01L 29/7786
2010/0219452 A1 * 9/2010 Brierley ................ H01L 29/432
257/E21.403
(Continued)

FOREIGN PATENT DOCUMENTS

| TW | 201842678 A | 12/2018 |
| TW | 1692868 B | 5/2020 |

OTHER PUBLICATIONS

Williams, G. "Etch Rates for Micromachining Processing—Part II" Jour. of Microelectromechanical sys. vol. 12, No. 6, Dec. 2003 pp. 761-778 (Year: 2003).*

(Continued)

*Primary Examiner* — Grant S Withers
(74) *Attorney, Agent, or Firm* — Birch, Stewart, Kolasch & Birch, LLP

(57) ABSTRACT

A semiconductor structure is provided. The semiconductor structure includes a substrate, a channel layer, a barrier layer, a compound semiconductor layer, a gate electrode, and a stack of dielectric layers. The channel layer is disposed on the substrate. The barrier layer is disposed on the channel layer. The compound semiconductor layer is disposed on the barrier layer. The gate electrode is disposed on the compound semiconductor layer. The stack of dielectric layers is disposed on the gate electrode. The stack of dielectric layers includes layers having different etching rates.

17 Claims, 6 Drawing Sheets

(51) Int. Cl.
*H01L 29/66* (2006.01)
*H01L 21/02* (2006.01)
*H01L 23/29* (2006.01)
*H01L 29/20* (2006.01)
*H01L 29/205* (2006.01)

(52) U.S. Cl.
CPC ...... *H01L 29/7786* (2013.01); *H01L 29/7787* (2013.01); *H01L 21/0206* (2013.01); *H01L 23/291* (2013.01); *H01L 29/2003* (2013.01); *H01L 29/205* (2013.01)

(56) References Cited

U.S. PATENT DOCUMENTS

2011/0227093 A1* 9/2011 Hikita ................. H01L 29/7786 257/E29.089
2014/0061659 A1* 3/2014 Teplik .................. H01L 29/402 257/E21.403
2020/0083167 A1* 3/2020 LaRoche ............. H01L 29/2003
2020/0357905 A1* 11/2020 Lu ........................ H01L 29/205

OTHER PUBLICATIONS

Huang, S. "Effective Passivation of AlGaN/GaN HEMTs by ALD-Grown AlN Thin Film" IEEE Elec. Dev. Lett. vol. 33, No. 4, Apr. 2012 pp. 516-518 (Year: 2012).*
Lucero, A. "Silicon Nitride Atomic Layer Deposition: A Brief Review of Precursor Chemistry" Mat. Matters vol. 13, No. 2 copyright 2018 pp. 55-59 (Year: 2018).*
Choi, Y. "Selective electrochemical etching of epitaxial aluminum nitride thin film" App. Surf. Sci. 509, Jan. 7, 2020 pp. 145279-1 through 145279-2 (Year: 2020).*
Taiwanese Office Action and Search Report for Taiwanese Application No. 109125928, dated May 25, 2021.

* cited by examiner

SEMICONDUCTOR STRUCTURE

TECHNICAL FIELD

Some embodiments of the present disclosure relates to a semiconductor structure, and, in particular, to a semiconductor structure including multilayer dielectric layers having different etching rates.

BACKGROUND

Gallium nitride (GaN) materials are used widely because they have various excellent features, such as a wide bandgap, high heat resistance, and a high electron saturation rate. Moreover, gallium nitride materials also have a strong polarization effect. The polarization effect of the gallium nitride materials includes spontaneous polarization effect and piezoelectric polarization effect. The spontaneous polarization effect is caused by lattice structures of the gallium nitride material. And the piezoelectric polarization effect is caused by lattice extrusion on account of lattice mismatch. Since the gallium nitride material can have the two polarization effects at the same time, the gallium nitride material will generate extremely large polarization charges at the heterojunction.

In view of the above-mentioned features of gallium nitride materials, gallium nitride-based semiconductors have been widely used in high electron mobility transistors (HEMT) including a heterojunction structure.

In general, a dielectric layer is provided in a high electron mobility transistor. For example, a dielectric layer may be used as an interlayer dielectric layer, a gate insulating layer, or an insulating layer between wirings. However, damage caused by a plasma process or an ion process, and/or damage caused by the existence of a seam may occur in an ordinary dielectric layer, resulting in the high electron mobility transistor being unreliable.

Therefore, although ordinary semiconductor structures have generally met the requirements for their intended uses, these ordinary semiconductor structures have not been fully satisfactory in all respects. Thus, there are still some problems to be solved regarding semiconductor structures which may be used as a high electron mobility transistor after further processing.

SUMMARY

In view of the above problems, some embodiments of the present disclosure further includes multilayer dielectric layers, wherein the multilayer dielectric layer includes layers having different etching rates.

According to some embodiments, a semiconductor structure is provided. The semiconductor structure includes a substrate, a channel layer, a barrier layer, a compound semiconductor layer, a gate electrode, and a stack of dielectric layers. The channel layer is disposed on the substrate. The barrier layer is disposed on the channel layer. The compound semiconductor layer is disposed on the barrier layer. The gate electrode is disposed on the compound semiconductor layer. The stack of dielectric layers is disposed on the gate electrode. The stack of dielectric layers includes layers having different etching rates.

According to some embodiments of the present disclosure, the semiconductor structures may be applied in various types of semiconductor devices. In order to make the features and advantages of some embodiments of the present disclosure more understand, some embodiments of the present disclosure are listed below in conjunction with the accompanying drawings, and are described in detail as follows.

BRIEF DESCRIPTION OF THE DRAWINGS

Through the following detailed description and the accompanying drawings, a person of ordinary skill in the art will better understand the viewpoints of some embodiments of the present disclosure. It should be noted that, in accordance with standard practice in the industry, various features are not drawn to scale and are used for illustration purposes only. In fact, the dimensions of the various features may be arbitrarily increased or reduced for clarity of discussion.

DETAILED DESCRIPTION

Figure 1:
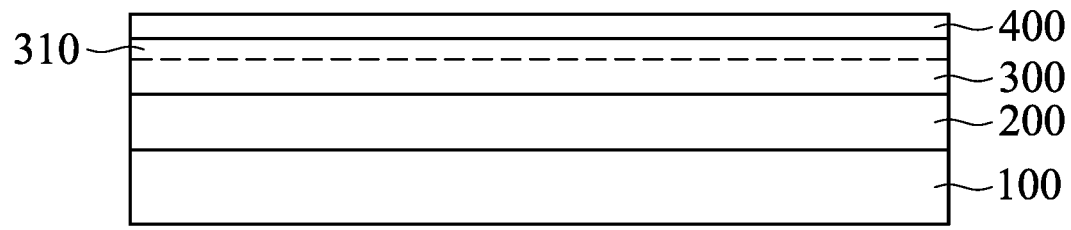
FIGS. 1-6 are schematic cross-sectional views of a semiconductor structure at various stages of fabrication, according to some embodiments of the present disclosure.

The following disclosure provides many different embodiments or examples for implementing different features of the semiconductor structure disclosed herein. Specific examples of each feature and its configuration are described below to simplify the embodiments of the present disclosure. Naturally, these are only examples and are not intended to limit the present disclosure. For example, if the description mentions that the first feature is formed on the second element, it may include an embodiment in which the first feature and second feature are in direct contact, or may include an embodiment in which additional feature is formed between the first feature and the second feature thereby the first feature and the second feature do not directly contact. In addition, some embodiments of the present disclosure may repeat reference numerals and/or letters in different examples. Such repetition is for conciseness and clarity, and is not used to indicate the relationship between the different embodiments and/or aspects discussed herein.

Some modifications of the embodiments are described below. In the different accompanying drawings and illustrated embodiments, reference numerals that are similar or the same are used to identify features that are similar or the same. It should be understood that additional operations and/or processes may be provided before, during, and after the method disclosed herein, and some of the described operations in some embodiments may be deleted or replaced with other embodiments of the method.

Furthermore, spatially relative terms, for example, "on", "over", "upper", "lower", "above", "below" or the like are used for ease of the present disclosure of one features relationship to another feature. The spatially relative terms are intended to encompass different orientations of the feature in use or operation, in addition to the orientation depicted in the accompany drawings. The features may be otherwise oriented (e.g., rotated 90 degrees or other orientations) and the spatially relative terms used herein should be interpreted accordingly.

Hereinafter, the terms "about", "approximately", and "substantially" usually mean within ±20% of a given value or a given range, for example, within ±10%, within 5%, within 3%, within 2%, within 1%, or within 0.5%. It should be noted that, the value provided in the specification is an approximate value, that is, without specific description of "about", "approximately", and "substantially", the meanings of the terms may still be implied.

FIGS. 1-6 are schematic cross-sectional views of a semiconductor structure at various stages of fabrication, according to some embodiments of the present disclosure.

Referring to FIG. 1, a substrate 100 is provided, and a buffer layer 200, a channel layer 300, and a barrier layer 400 are formed on the substrate 100. The buffer layer 200 may be disposed on the substrate 100. The channel layer 300 may be disposed on the buffer layer 200 and the substrate 100. In some embodiments of the present disclosure, the buffer layer 200 may be disposed between the substrate 100 and the channel layer 300. The barrier layer 400 may be disposed on the channel layer 300.

In some embodiments of the present disclosure, the substrate 100 may be, or include, a bulk semiconductor substrate, a semiconductor-on-insulator (SOI) substrate, or the like. The substrate 100 may be doped, for example, using p-type dopants or n-type dopants or undoped. In general, the semiconductor-on-insulator substrate includes a film layer of semiconductor material formed on the insulating layer. For example, the insulating layer may be a silicon oxide layer, a silicon nitride layer, a poly-silicon layer, combination thereof, or a stack of the foregoing film layers. The insulating layer is disposed on a substrate, such as silicon or aluminum nitride (AlN) substrate. Other substrates may also be used, such as a multilayer substrate or a gradient substrate. In some embodiments of the present disclosure, the semiconductor material of the substrate 100 may include silicon with different crystal planes, including Si(111) or Si(110). In some embodiments of the present disclosure, the substrate 100 may be a semiconductor substrate or a ceramic substrate, such as a Gallium Nitride (GaN) substrate, a silicon carbide (SiC) substrate, an aluminum nitride substrate, or a sapphire substrate. In some embodiments of the present disclosure, the substrate 100 may include a thin film transistor (TFT) substrate.

In some embodiment of the present disclosure, mismatch occurred between the channel layer 300 and the substrate 100 may generate strain of the channel layer 300. Since the buffer layer 200 may be disposed between the channel layer 300 and the substrate 100, the buffer layer 200 may reduce or prevent the strain of the channel layer 300 formed on the buffer layer 200, in order to prevent forming defects in the channel layer 300. The material of the buffer layer 200 may include an III-V group compound semiconductor material, such as an III group nitride. For example, the material of the buffer layer 200 may be, or include, gallium nitride, aluminum nitride, aluminum gallium nitride (AlGaN), aluminum indium nitride (AlInN), a single layer or multiple layers of foregoing combination, or any other suitable material. In some embodiments of the present disclosure, the buffer layer 200 may include aluminum gallium nitride. In some embodiments of the present disclosure, the buffer layer 200 may be formed by a deposition process. The foregoing deposition process for forming the buffer layer 200 may be metal organic chemical vapor deposition (MOCVD), atomic layer deposition (ALD), molecular beam epitaxy (MBE), liquid phase epitaxy (LPE), combinations thereof, or any other suitable process, but it is not limited thereto.

In some embodiments of the present disclosure, a nucleation layer (not shown) may be further disposed between the substrate 100 and the buffer layer 200. A material of the nucleation layer may be, or include, aluminum nitride, aluminum gallium nitride, combinations thereof, or any other suitable material. The nucleation layer may be formed by a deposition process, such as metal organic chemical vapor deposition, atomic layer deposition, molecular beam epitaxy, liquid phase epitaxy, combinations thereof, or any other suitable process, but it is not limited thereto. The nucleation layer may reduce and/or prevent lattice difference between the substrate 100 and any other layer disposed on the substrate 100, to improve crystallization.

In some embodiments of the present disclosure, a material of the channel layer 300 may be, or include, one or more group III-V compound semiconductor materials, such as group III nitrides, but it is not limited thereto. For example, the material of the channel layer 300 may be, or include, gallium nitride, aluminum gallium nitride, aluminum indium nitride, indium gallium nitride (InGaN), indium aluminum gallium nitride (InAlGaN), combinations thereof, or any other suitable material, but it is not limited thereto. The channel layer 300 may be formed by a deposition process such as metal organic chemical vapor deposition, atomic layer deposition, molecular beam epitaxy, liquid phase epitaxy, combinations thereof, or any other suitable process, but it is not limited thereto. In some embodiments of the present disclosure, the channel layer 300 may include gallium nitride.

In some embodiments of the present disclosure, a material of the barrier layer 400 may be, or include, III-V group compound semiconductor material, such as an III group nitride. For example, the barrier layer 400 may be, or include, aluminum nitride, aluminum gallium nitride, aluminum indium nitride, indium aluminum gallium nitride, combinations thereof, or any other suitable material, but it is not limited thereto. The barrier layer 400 may include a single layer structure or a multilayer structure. The barrier layer 400 may be formed by a deposition process such as metal organic chemical vapor deposition, atomic layer deposition, molecular beam epitaxy, liquid phase epitaxy, combinations thereof, or any other suitable process, but it is not limited thereto. In some embodiments of the present disclosure, the barrier layer 400 may include aluminum gallium nitride.

For example, the different between lattice constants of gallium nitride as the channel layer 300 and aluminum gallium nitride as the barrier layer 400 induce piezoelectric polarization effects and respective spontaneous polarization effects. Therefore, two-dimensional electron gas (2DEG) channel may be formed at the hetero interface between the channel layer 300 and the barrier layer 400 (as shown in the dotted line of FIG. 1). In some embodiments of the present disclosure, the two-dimensional electron gas channel is used to provide a current path of the conductive carriers, wherein the conductive carriers are transferred in the subsequently formed high electron mobility transistor. In some embodiments of the present disclosure, there are no dopants in the channel layer 300 and/or the barrier layer 400. In some other embodiments of the present disclosure, the channel layer 300 and/or the barrier layer 400 may have dopants, which may be either n-type dopants or p-type dopants.

Figure 2:
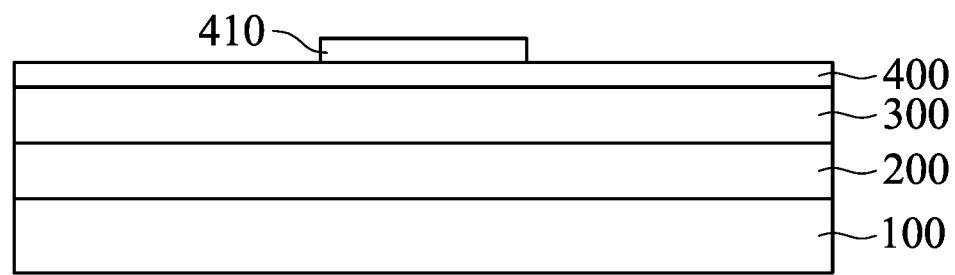

Referring to FIG. 2, a compound semiconductor layer 410 is disposed on the barrier layer 400. The compound semiconductor layer 410 may be p-type doped or n-type doped gallium nitride. In some embodiments of the present disclosure, the compound semiconductor layer 410 may include p-type doped gallium nitride. The compound semiconductor layer 410 may inhibit the two-dimensional electron gas channel below the compound semiconductor layer 410 to overcome the safety problem occurred at normally-on state of the ordinary high electron mobility transistors. Therefore, according to some embodiments of the present disclosure, the subsequently formed high electron mobility transistor with the compound semiconductor layer 410 is at normally-on state. The compound semiconductor layer 410 may be disposed corresponding to a subsequently formed gate electrode.

Figure 3:
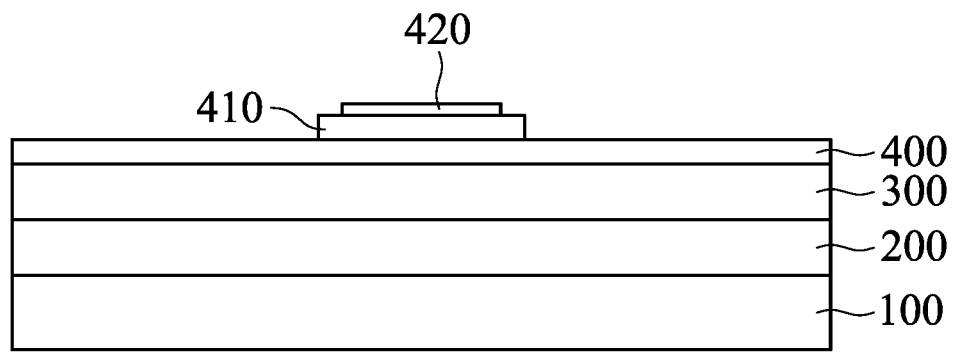

Referring to FIG. 3, a metal nitride layer 420 is optionally disposed on the compound semiconductor layer 410. The metal nitride layer 420 may also be disposed corresponding to the subsequently formed gate electrode. In some embodiments of the present disclosure, the metal nitride layer 420 may include titanium nitride (TiN). The metal nitride layer 420 may improve the adhesion of the compound semiconductor layer 410 to other layers. The metal nitride layer 420 may reduce the leakage current. The metal nitride layer 420 may be used as an etching stop layer for subsequent formed openings. The metal nitride layer 420 may also reduce and/or prevent a breakdown of the drain current along with increasing drain bias. In some embodiments of the present disclosure, the metal nitride layer 420 may be omitted.

In some embodiments of the present disclosure, the compound semiconductor layer 410 and the metal nitride layer 420 may be formed by a series of processes including a deposition process, a lithography process, and an etching process. For example, in some embodiments of the present disclosure, a compound semiconductor material layer may be formed on the barrier layer 400 by a deposition process. Then, a patterned mask layer is formed on the compound semiconductor material layer, to expose a portion of the compound semiconductor material layer. Afterward, the aforementioned compound semiconductor material is patterned, that is, the portion of the compound semiconductor material layer which is not covered by the patterned mask layer is etched to form the compound semiconductor layer 410. Similarly, a metal nitride material layer may be formed on the compound semiconductor layer 410 by a deposition process. Then, a patterned mask layer is formed on the metal nitride material layer, to expose a portion of the metal nitride material layer. Afterward, the aforementioned metal nitride material layer is patterned, that is, the portion of the metal nitride material layer which is not covered by the patterned mask layer is etched to form the metal nitride layer 420. In some embodiments of the present disclosure, the channel layer 300, the barrier layer 400, the compound semiconductor layer 410, and the metal nitride layer 420 may also be collectively referred as an epitaxial layer.

Figure 4:
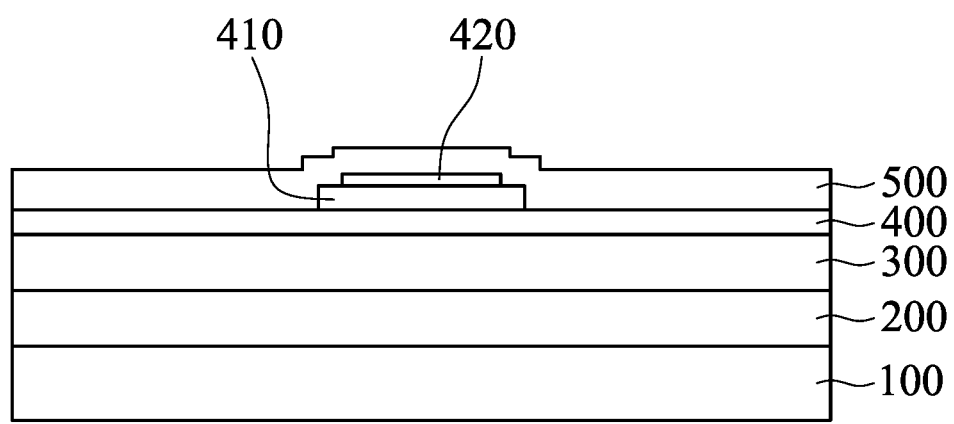

Referring to FIG. 4, a dielectric layer 500 is disposed on the barrier layer 400. The dielectric layer 500 may be disposed on a portion of the barrier layer 400, a portion of the compound semiconductor layer 410, and a portion of the metal nitride layer 420. The dielectric layer 500 may be disposed between the barrier layer 400 and the subsequently formed a stack of dielectric layers. In some embodiments of the present disclosure, the dielectric layer 500 may have a flat surface. In some embodiments of the present disclosure, dielectric layer 500 may have a step-shaped surface. In other words, the shape of the surface corresponds to a shape of the compound semiconductor layer 410 and a shape of the metal nitride layer 420. For example, the dielectric layer 500 may be conformally formed on the surfaces of the barrier layer 400, the compound semiconductor layer 410 and the metal nitride layer 420. It should be noted that, the step-shaped surface of the dielectric layer 500 as shown in FIG. 4 is only an example and not limited thereto. That is, the shape of the dielectric layer 500 is not limited to that of FIG. 4. In some embodiments of the present disclosure, the corners of the step-shaped surface of the dielectric layer 500 may be acute angel, right angle, rounded angel, obtuse angel, or any other suitable shape. In some embodiments of the present disclosure, the dielectric layer 500 may have any shape corresponding to the height difference between the surfaces of the barrier layer 400, the compound semiconductor layer 410 and the metal nitride layer 420. That is, the dielectric layer 500 may have a shape corresponding to step gapes between the barrier layer 400, the compound semiconductor layer 410 and the metal nitride layer 420.

Figure 5:
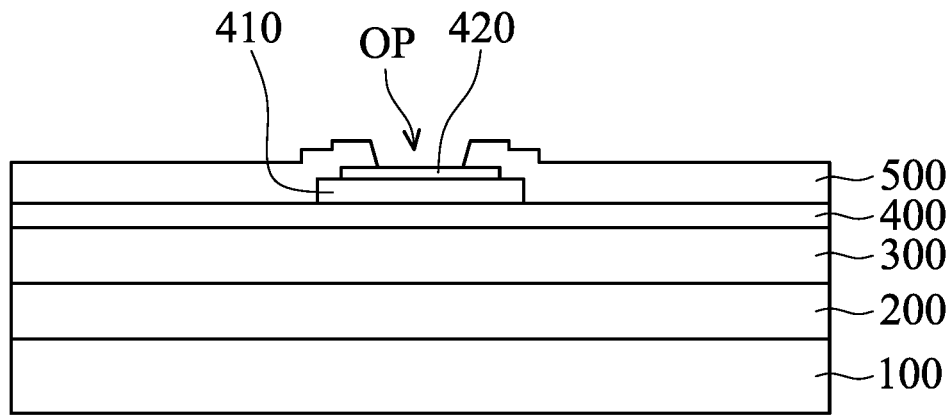

Referring to FIG. 5, a portion of the dielectric layer 500 is selectively removed to form an opening OP. The opening OP may penetrate the dielectric layer 500, so the opening OP may expose a portion of the metal nitride layer 420. A position of the opening OP corresponds to a position of the subsequently formed gate electrode. The opening OP may be formed by a lithography process and an etching process. The etching process may include dry etching process, wet etching process, or other etching process, such as a reactive ion etching process. The etching process may also be chemical etching, such as plasma etching; physical etching, such as ion polishing; or a combination thereof. In some embodiments of the present disclosure, the etching process used for forming the opening OP may be a dry etching process. In some embodiments of the present disclosure, when the etching process is performed to form the openings OP, the metal nitride layer 420 is used as an etching stop layer. The etching process is stopped at the metal nitride layer 420, so that the compound semiconductor layer 410 below the metal nitride layer 420 is protected by the metal nitride layer 420 and the compound semiconductor layer 410 is not damaged.

Figure 6:
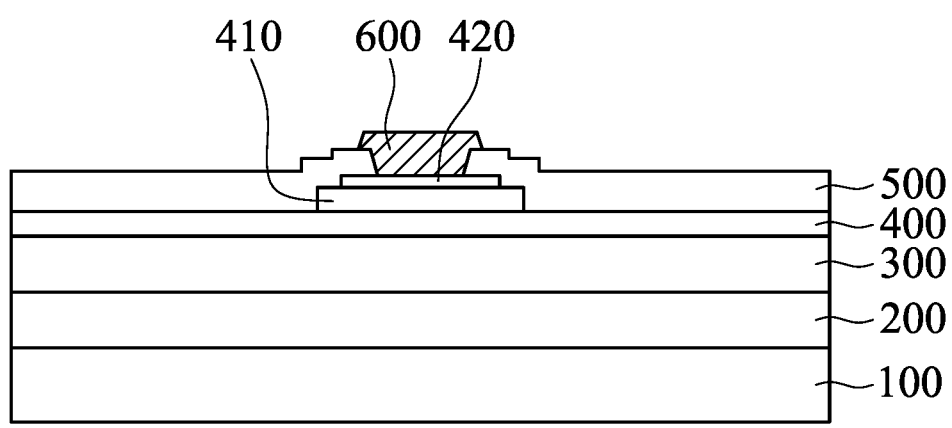

Referring to FIG. 6, a gate electrode 600 is disposed in the opening OP, and is disposed on the compound semiconductor layer 410. The gate electrode 600 may protrude from the dielectric layer 500. A material of the gate electrode 600 may be a conductive material such as a metal, a metal nitride, a semiconductor material, combinations thereof, or any other suitable conductive material, but it is not limited thereto. In some embodiments of the present disclosure, the metal may be gold (Au), nickel (Ni), platinum (Pt), palladium (Pd), iridium (Ir), titanium (Ti), chromium (Cr), tungsten (W), aluminum (Al), copper (Cu), or the like, or a combination thereof, but it is not limited thereto. The semiconductor material may be polycrystalline silicon or polycrystalline germanium. The foregoing conductive material may be formed in the opening OP by, for example, a chemical vapor deposition (CVD) process, sputtering, a resistance thermal evaporation process, an electron beam evaporation process, or another suitable deposition process. Similarly, a conductive material layer may be formed on the metal nitride layer 420, and then conductive material layer that is formed may be patterned to form the gate electrode 600.

Figure 7A:
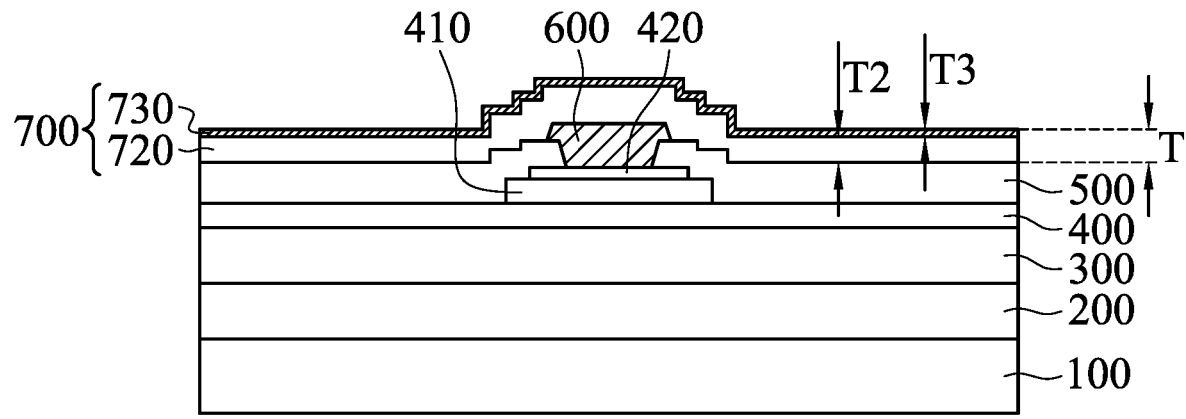
FIGS. 7A-7C are schematic views of a stack of dielectric layers in various aspects, according to some embodiments of the present disclosure.
Figure 7B:
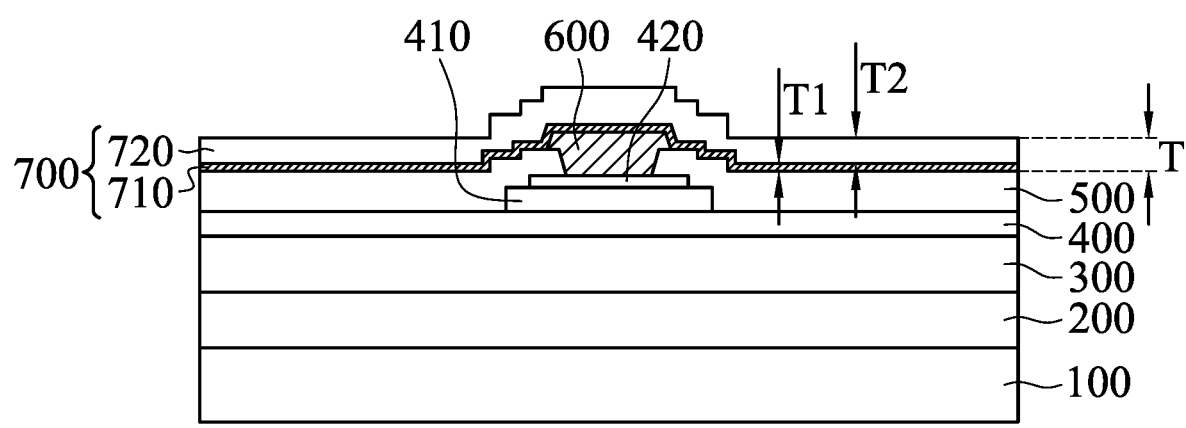
Figure 7C:
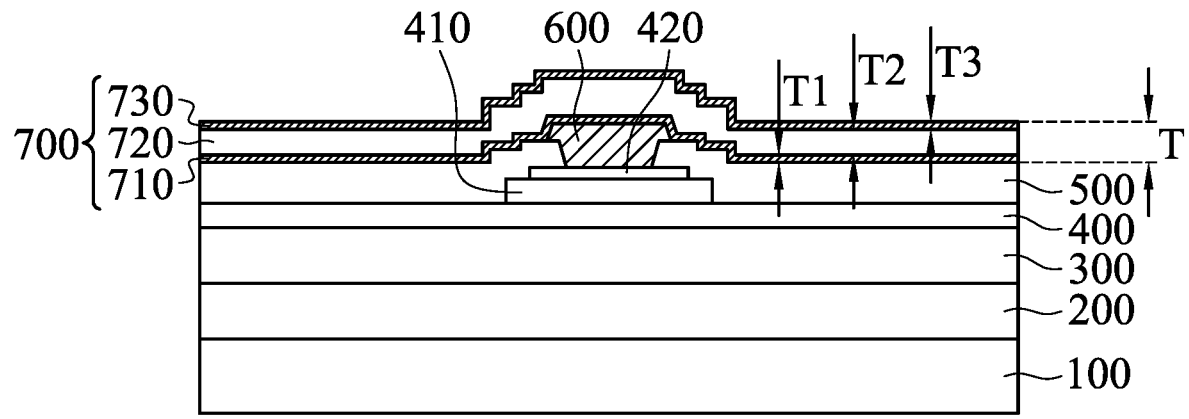

Referring to FIGS. 7A-7C, the semiconductor structures shown in FIGS. 7A-7C are the semiconductor structure shown in FIG. 6 with different aspects of a stack of dielectric layers 700 disposed on them. In some embodiments of the present disclosure, the stack of dielectric layers 700 is disposed on the gate electrode 600. The stack of dielectric layers 700 includes structures and/or features that are capable of resisting or reducing the etching rate of the wet etching solution, such as a wet etchant, used in the wet cleaning process. Thus, the gate electrode 600 disposed under the stack of dielectric layers 700 is not eroded by the wet etching solution, and is thereby protected from damage.

It should be noted that the wet cleaning process may be regarded as a kind of wet etching. In order to remove particles, organics, pollutants, metals, and native oxide generated in each step of forming the semiconductor structure, it is necessary to perform the cleaning process multiple times during the entire process. For example, wet cleaning may occur during a pre-cleaning process, after an etching process, and/or after a deposition process. The "etching rate" of any of the layers disclosed herein refers to the specific etching rate of that layer relative to the specific wet etching solution used in the wet cleaning process. In other words, the etching rate of a layer disclosed herein depends on the wet etching solution that is used. However, during the wet cleaning process, a layer that is included in the semiconductor structure may have seams, cracks, and/or defects, and therefore the wet cleaning solution used in the wet cleaning process may penetrate the seams, cracks, and/or defects, resulting in damage to the features disposed below the foregoing layer. The wet cleaning process may use an acidic wet etching solution or an alkaline wet etching solution. The wet etching solution may be, or include, but is not limited to, standard cleaning solution 1 (SC-1, APM), standard cleaning solution 2 (SC-2, HPM), a mixture of sulfuric acid and hydrogen peroxide (Piranha, SPM), combinations thereof, or any other suitable etching solution.

For example, the oxide layer which is used as the dielectric layer may include oxide seams caused by the deposition process. When an acid wet etching solution is used in the wet cleaning process, the acid wet etching solution may penetrate into the oxide seams of the oxide layer, causing the acidic wet etching solution to contact with the features that should not be cleaned, resulting in leakage of the acid wet etching solution. The acidic wet etching solution may react with metal. Thus, any features disposed below the oxide layer, which the feature includes metal, are damaged due to the leakage of the acid wet etching solution. If the stack of dielectric layers 700 under which the gate electrode 600 is disposed has seams, cracks, and/or defects as mentioned above, the gate electrode 600 may be damaged. Once the gate electrode 600 is damaged, the semiconductor structure will be damaged and the electrical properties of the semiconductor structure may be degraded. Therefore, according to some embodiments of the present disclosure, one of the purposes of the present disclosure is to prevent any metal-based features disposed under the stack of dielectric layers 700 from being damaged.

It should also be noted that, in the high electron mobility transistor (HEMT) including a heterojunction structure, an on-resistance ($R_{on}$) is mainly determined by the two-dimensional electron gas channel, a heterojunction between the source and the channel layer 300, and a heterojunction between the drain and the channel layer 300. Since the resistance of the heterojunctions between the source and drain and the channel layer 300 is extremely high, a heating process such as a rapid thermal process (RTP) may usually be performed, to make a portion of the metal of the source and the drain diffuses into the two-dimensional electron gas channel, thereby forming a well ohmic contact. However, during the foregoing rapid thermal process, the metals of the source and the drain may also be diffused into other layers, such as the stack of dielectric layers 700, causing the material of the stack of dielectric layers 700 and the metals of the source and the drain to produce a spiking effect and/or a metal extrusion phenomenon, resulting in a short-circuits between the source, drain and gate. Therefore, according to some embodiments of the present disclosure, one of the purposes of the present disclosure is to prevent the spiking effect. For the above purposes, a more detailed description is given below.

In some embodiments of the present disclosure, the stack of dielectric layers 700 may be disposed on the gate electrode 600. For example, the stack of dielectric layers 700 may be conformally disposed on the dielectric layer 500 and the gate electrode 600. Since the dielectric layer 500 may have a step-shaped surface, and the gate electrode 600 may protrude from the dielectric layer 500, the stack of dielectric layers 700 which is conformally disposed on the dielectric layer 500 and the gate electrode 600 may also have a step-shaped surface. It should be noted that, as the foregoing dielectric layer 500 may have a step-shaped surface but not limited thereto, the step-shaped surface of the stack of dielectric layers 700 shown in FIGS. 7A-7C is only an example and not a limitation. In other words, the shape of the surface of the stack of dielectric layers 700 is not limited to the shapes shown in FIGS. 7A-7C. In some embodiments of the present disclosure, the corners of the step-shaped surface of the stack of dielectric layers 700 may be acute angel, right angle, rounded angel, obtuse angel, or any other suitable shape. In some embodiments of the present disclosure, the stack of dielectric layers 700 may have any shape corresponding to the height difference between the surfaces of dielectric layer 500 and the gate electrode 600. That is, the stack of dielectric layers 700 may have a shape corresponding to gapes.

In some embodiments of the present disclosure, the stack of dielectric layers 700 includes at least two layers having different etching rates. According to some embodiments of the present disclosure, by disposing the stack of dielectric layers 700 including at least two layers having different etching rates, the formation of seams, cracks, and/or defects in the single layer dielectric layer may be reduced and/or avoided, thereby improving the reliability of the entire semiconductor structure. In addition, since the stack of dielectric layers 700 is provided with at least two layers having different etching rates, a layer with a lower etching rate, that is, the layer with stronger resistance to the wet etching solution may protect any features disposed below the layer, in particular, even if it containing a metal component below the layer. Thus, according to some embodiments of the present disclosure, the problems of acid leakage and/or etching or damaging the underlying metal during the wet cleaning process may be solved, thereby improving the reliability of the entire semiconductor structure. Furthermore, in some embodiments of the present disclosure, since the stack of dielectric layers 700 may have a step-shaped surface and may include at least two layers, seams, cracks, and/or defects that are easily generated at the corners of the step-shaped surface of the stack of dielectric layers 700 may be effectively prevented.

In some embodiments of the present disclosure, the total thickness of the stack of dielectric layers 700 is 2400 Å-3000 Å. In some embodiments of the present disclosure, the total thickness of the stack of dielectric layers 700 is 2500 Å-2800 Å. It should be noted that, in some embodiments of the present disclosure, the total thickness of the stack of dielectric layers 700 is related to achieve the optimal electric field distribution of the subsequently formed high electron mobility transistor with one field plate therein. However, for the subsequently formed high electron mobility transistor with different numbers, thicknesses, shapes and arrangements of field plates, the optimal value of the thickness of the stack of dielectric layers 700 will be changed correspondingly, and is not limited thereto.

In some embodiments of the present disclosure, the stack of dielectric layers 700 may be, or include, oxide, nitride, oxynitride, combination thereof or any other suitable material. The stack of dielectric layers 700 may be, or include, aluminum oxide ($Al_2O_3$), silicon oxide, silicon nitride, silicon oxynitride, derivatives from tetraethoxysilane (TEOS), derivatives from silane ($SiH_4$), phosphosilicate glass (PSG), borophosphosilicate glass (BPSG), fluorinated silica glass (FSG), hydrogen silsesquioxane (HSQ), carbon-doped silicon oxide, amorphous fluorinated carbon, parylene, bisbenzocyclobutenes (BCB), or polyimide. For example, the stack of dielectric layers 700 may be formed by a spin coating process, chemical vapor deposition process, physical vapor deposition (PVD) process, atomic layer deposition (ALD) process, high density plasma chemical vapor deposition (HDPCVD) process, plasma enhanced chemical vapor deposition (PECVD) process, or any other suitable deposition process.

In some embodiments of the present disclosure, since aluminum oxide has well thermal stability, a dense structure, and does not easily affect the entire electrical properties of the semiconductor structure, the stack of dielectric layers 700 may include aluminum oxide. In some embodiments of the present disclosure, the stack of dielectric layers 700 may include at least two layers that are substantially the same compound but they have different etching rates. For example, the stack of dielectric layers 700 may include tetraethoxysilane (TEOS) derived silicon dioxide and silane ($SiH_4$) derived silicon dioxide to form the two layers.

In some embodiments of the present disclosure, in the stack of dielectric layers 700, a ratio of the etching rates of the two layers may be 1.1 to 8.0 in the wet etching solution. Alternatively, in some embodiments of the present disclosure, said ratio may be 1.5, 2.0, 2.5, 3.0, 3.5, 4.0, 4.5, 5.0, 5.5, 6.0, 6.5, 7.0, 7.5, or a range constituted by any of the above values.

In some embodiments of the present disclosure, and when the wet etching solution is hydrofluoric acid (HF' hydrofluoric acid), the etching rate ratio of the two layers may be 6. In some embodiments of the present disclosure, and when the wet etching solution is a hydrofluoric acid solution with a $HF:H_2O$ volume ratio of about 1:50, a ratio of the etching rates of the two layers of the stack of dielectric layers 700 may be greater than 2. In some embodiments of the present disclosure, when the wet etching solution is a buffered oxide etchant (BOE) solution with a $NH_4F:HF$ volume ratio of about 10:1, a ratio of the etching rates of the two layers of the stack of dielectric layers 700 may be greater than 1.5. However, the present disclosure is not limited thereto, and a person of ordinary skill in the art may adjust the ratio to meet requirements.

As shown in FIG. 7A, the stack of dielectric layers 700 may include a main layer 720 and a capping layer 730. The main layer 720 may be disposed on the gate electrode 600. The capping layer 730 may be disposed on the main layer 720. Compared with the main layer 720, the capping layer 730 may be farther away from the gate electrode 600. An etching rate of the capping layer 730 is lower than an etching rate of the main layer 720. The capping layer 730 may fill the oxide seams of the main layer 720, so the capping layer 730 may protect the features containing metal components and disposed below the capping layer 730 from being damaged by the wet etching solution. Moreover, the capping layer 730 may also prevent the spiking effect during the rapid thermal process. As shown in FIG. 7A, the total thickness T of the stack of dielectric layers 700 may be about 2400 Å-3000 Å. In some embodiments of the present disclosure, the thickness T2 of the main layer 720 may be about 2500 Å, and the thickness T3 of the capping layer 730 may be about 1 Å-500 Å. In some embodiments of the present disclosure, the thickness T3 of the capping layer 730 may be about 50 Å-100 Å. A ratio of the thickness of the main layer 720 to that of the capping layer 730 may be about 1:1-60:1. In some embodiments of the present disclosure, the main layer 720 may be thicker than the capping layer 730, but it is not limited thereto. In some embodiments of the present disclosure, the thickness of the main layer 720 may be substantially equal to or less than that of the capping layer 730, and the thickness of the main layer 720 and that of the capping layer 730 may be about 1000 Å-2000 Å.

The term "main layer" used herein does not refer a main material of the stack of dielectric layers 700. In some embodiments of the present disclosure, the main layer 720 may be made of silicon oxide, and the capping layer 730 may be made of aluminum oxide. In some embodiments of the present disclosure, the capping layer 730 may be made of aluminum oxide formed by an atomic layer deposition process, to make it thin and dense, and to fill the seams of the main layer 720 at the same time.

In some embodiments of the present disclosure, the main layer 720 may be silicon oxide formed by chemical vapor deposition process using $SiH_4$ as a precursor. However, the capping layer 730 may be silicon oxide formed by thermal oxidation process using TEOS as a precursor. It should be noted that, in some embodiments of the present disclosure, although the main layer 720 and capping layer 730 both include silicon oxide with same chemical formula, silicon oxides formed by different processes and different precursors substantially have different properties. For example, in some wet etching solutions, an etching rate of silicon oxide formed by chemical vapor deposition process that uses $SiH_4$ as a precursor is higher than an etching rate of silicon oxide formed by a thermal oxidation process that uses TEOS as a precursor. Therefore, as shown in FIG. 7A, the stack of dielectric layers 700 including the capping layer 730 disposed on the main layer 720 may effectively protect the underlying features from being damaged by the wet etching solution.

As shown in FIG. 7B, the stack of dielectric layers 700 may include a bottom layer 710 and a main layer 720. The bottom layer 710 may be disposed on the gate electrode 600. The main layer 720 may be disposed on the bottom layer 710. Compared with the bottom layer 710, the main layer 720 may be farther away from the gate electrode 600. An etching rate of the bottom layer 710 is lower than an etching rate of the main layer 720. Because the bottom layer 710 is first disposed on the gate electrode 600, a denser layer may be disposed on the gate electrode 600. The bottom layer 710 may protect the features containing metal components and disposed below the bottom layer 710 from being damaged by the wet etching solution. Moreover, the bottom layer 710 may prevent the spiking effect during the rapid thermal process. As shown in FIG. 7B, the total thickness T of the stack of dielectric layers 700 may be about 2400 Å-3000 Å. In some embodiments of the present disclosure, the thickness T2 of the main layer 720 may be about 2500 Å-2800 Å, and the thickness T1 of the bottom layer 710 may be about 1 Å-500 Å. In some embodiments of the present disclosure, the thickness T1 of the bottom layer 710 is about 50 Å-100 Å. In some embodiments of the present disclosure, a ratio of the thickness of the bottom layer 710 to that of the main layer 720 may be about 1:1-1:60.

In some embodiments of the present disclosure, the main layer 720 may be made of silicon oxide, and the bottom layer 710 may be made of aluminum oxide. In some embodiments of the present disclosure, the bottom layer 710 may be made of aluminum oxide and formed by an atomic layer deposition process, to make it thin and dense. In some embodiments of the present disclosure, the main layer 720 may be made of silicon oxide and formed by a chemical vapor deposition process using $SiH_4$ as a precursor, and the bottom layer 710 may be made of silicon oxide formed by a thermal oxidation process using TEOS as a precursor. Here, the advantages of choosing silicon oxides formed by different processes and precursors will not be repeated for clarity.

As shown in FIG. 7C, the stack of dielectric layers 700 may include a bottom layer 710, a main layer 720, and a capping layer 730. The bottom layer 710 may be disposed on the gate electrode 600. The main layer 720 may be disposed on the bottom layer 710. The capping layer 730 may be disposed on the main layer 720. An etching rate of the bottom layer 710 is lower than an etching rate of the main layer 720, and an etching rate of the capping layer 730 is lower than the etching rate of the main layer 720. In other words, the stack of dielectric layers 700 has a sandwich-like structure. The main layer 720 may be disposed between the bottom layer 710 and the capping layer 730, which have a lower etching rate. Thus, the main layer 720 may be protected by the bottom layer 710 and the capping layer 730. As shown in FIG. 7C, in some embodiments of the present disclosure, the total thickness T of the stack of dielectric layers 700 may be about 2400 Å-3000 Å. In some embodiments of the present disclosure, the thickness T1 of the bottom layer 710 may be about 50 Å-100 Å, the thickness T2 of the main layer 720 may be about 2500 Å-2800 Å, and the thickness T3 of the capping layer 730 may be about 50 Å-100 Å. A thickness ratio of the bottom layer 710, the main layer 720, and the capping layer 730 may be 1:24:1-1:60:1.

In some embodiments of the present disclosure, the bottom layer 710 may be aluminum oxide, the main layer 720 may be silicon oxide, and the capping layer 730 may be aluminum oxide. In some embodiments of the present disclosure, the bottom layer 710 and the capping layer 730 may be both aluminum oxide formed by an atomic layer deposition process. The main layer 720 may be disposed between the bottom layer 710 and the capping layer 730, thus the features containing metal components and disposed below the stack of dielectric layers 700 may be more effectively protected. Furthermore, a process window of the wet cleaning process may be improved. In some embodiments of the present disclosure, the bottom layer 710 and the capping layer 730 may be silicon oxides formed by a thermal oxidation process using TEOS as a precursor, and the main layer 720 may be silicon oxide formed by a chemical vapor deposition process using $SiH_4$ as a precursor. Here, the advantages of choosing silicon oxides formed by different processes and precursors will not be repeated for clarity.

Following the above, a further process may be performed to form a high electron mobility transistor. As follows, description is made based on the embodiment shown in FIG. 7C as an example.

Figure 8:
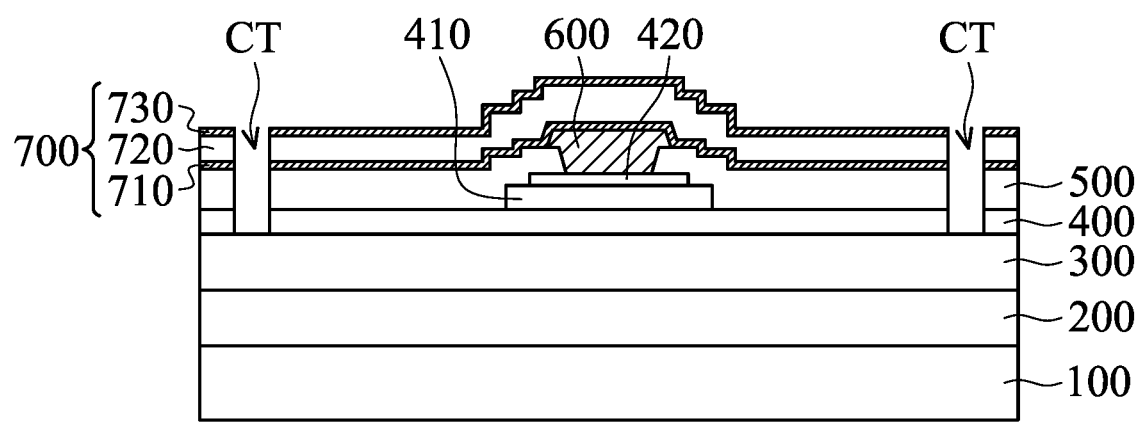
FIGS. 8 and 9 are schematic cross-sectional views of a semiconductor structure at various stages of fabrication, according to some embodiments of the present disclosure.

Referring to FIG. 8, a contact via CT penetrating through the barrier layer 400, the dielectric layer 500 and the stack of dielectric layers 700 is formed. The contact via CT may be disposed on both sides of the gate electrode 700. The contact via CT is used to form a drain electrode and a source electrode.

Figure 9:
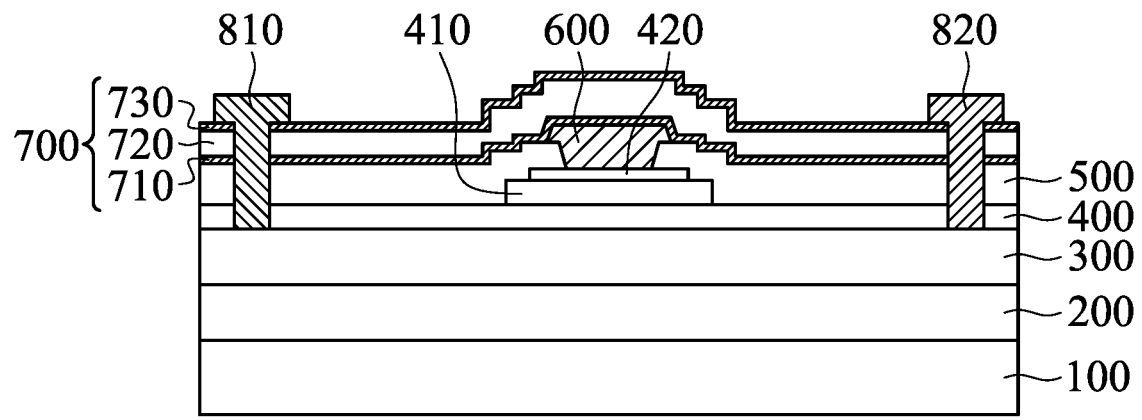

Referring to FIG. 9, a conductive material is deposited in the contact via CT, and the deposited conductive material is patterned to form a source electrode 810 disposed on one side of the gate electrode 600 and in contact with the channel layer 300, and the drain electrode 820 disposed on the other side of the gate electrode 600 and in contact with the channel layer 300, so as to obtain a high electron mobility transistor as an embodiment of the semiconductor structure of the present disclosure.

In some embodiments of the present disclosure, a field plate may be further disposed in the semiconductor structure of the present disclosure to improve charge balance of the semiconductor structure. In some embodiments of the present disclosure, the dielectric layer 500 in the semiconductor structure of the present disclosure may be replaced by a stack of dielectric layers 700. In some embodiments of the present disclosure, during further processing, the stack of dielectric layers 700 may be disposed between the above-mentioned electrodes, between any wiring, or at a location where any ordinary dielectric layer may be disposed, to effectively protect the underlying features that contain metal components.

Figure 10:
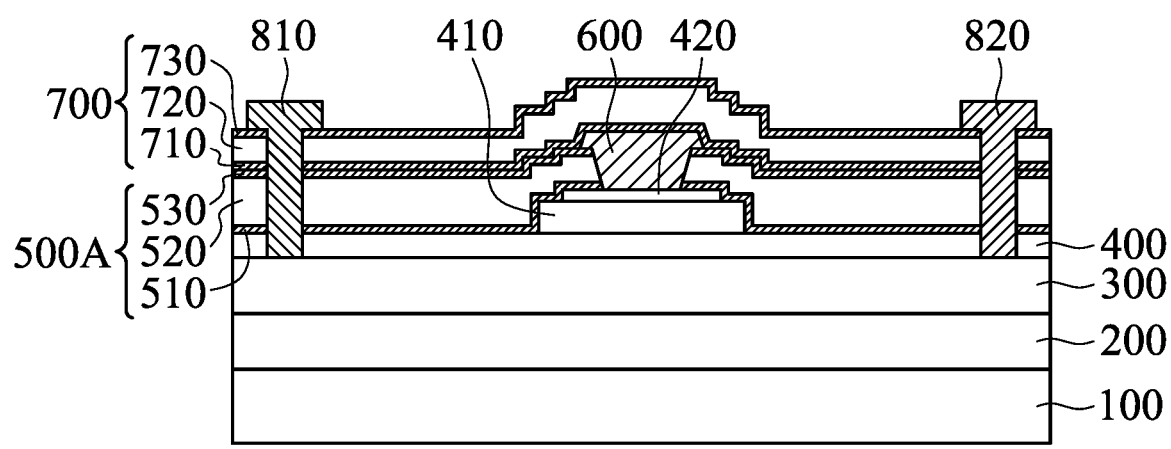
FIG. 10 is a schematic cross-sectional view of a semiconductor structure, according to some embodiments of the present disclosure.

Referring to FIG. 10, it is a schematic cross-sectional view of a semiconductor structure according to some embodiments of the present disclosure. As shown in FIG. 10, the dielectric layer disposed between the barrier layer 400 and the stack of dielectric layers 700 may include another stack of dielectric layers 500A. Similar to the stack of dielectric layers 700, another stack of dielectric layers 500A includes at least two layers having different etching rates. The stack of dielectric layers 500A may have the same structure as the various structures of the stack of dielectric layers 700 in the some embodiments of the foregoing embodiments. For example, as shown in FIG. 10, another stack of dielectric layers 500A may include a bottom layer 510, a main layer 520, and a capping layer 530, but it is not limited thereto.

In addition, in some embodiments of the present disclosure, another stack of dielectric layers may be further disposed on the stack of dielectric layers. The foregoing another stack of dielectric layers includes at least two layers having different etching rates. In other words, according to some embodiments of the present disclosure, the semiconductor structure may include a single stack of dielectric layers or multiple stacks of dielectric layers to protect the underlying features.

In summary, according to some embodiments of the present disclosure, some embodiments of the present disclosure reduces cracks in the dielectric layer by disposing a stack of dielectric layers including at least two layers, thereby avoiding the damage of the features below the stack of dielectric layers during the wet cleaning process, in particular, the features which contain metal component. At the same time, according to some embodiments of the present disclosure, the stack of dielectric layers including at least two layers prevents the metal spiking effect generated during the rapid thermal process. In some embodiments of the present disclosure, the stack of dielectric layers disclosed herein may be disposed at any suitable location for the ordinary dielectric layer, and the stack of dielectric layers disclosed herein may replace any ordinary dielectric layer. Therefore, the stack of dielectric layers disclosed herein may be applied in various accepts of semiconductor structures.

Although some embodiments of the present disclosure and their advantages have been disclosed, it should be understood that, a person of ordinary skill in the art may change, replace, substitute and/or modify the present disclosure without departing from the spirit and scope of the present disclosure. In addition, the scope of the present disclosure is not limited to the manufacturing process, machine, manufacturing, material composition, device, method, structure and step in the specific embodiments described in the specification. A person of ordinary skill in the art will understand current and future manufacturing processes, machine, manufacturing, material composition, device, method, structure and step from the content disclosed in some embodiments of the present disclosure, as long as the current or future manufacturing processes, machine, manufacturing, material composition, device, method, structure and step performs substantially the same functions or obtain substantially the same results as the present disclosure. Therefore, the scope of the present disclosure includes the above-mentioned manufacturing process, machine, manufacturing, material composition, device, method, structure and steps. Moreover, each of the claims constitutes an individual embodiment, and the scope of the present disclosure also includes combinations of each of the claims and embodiments.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for changing, replacing, substituting and/or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a channel layer disposed on the substrate;
a barrier layer disposed on the channel layer;
a compound semiconductor layer disposed on the barrier layer and including p-type doped gallium nitride;
a gate electrode disposed on the compound semiconductor layer and having a first side and a second side, wherein the first side and the second side of the gate electrode are parallel to a surface of the substrate,
a stack of dielectric layers conformally disposed on the first side of the gate electrode, wherein the first side of the gate electrode is between the stack of dielectric layers and the gate electrode and the second side of the gate electrode is between the gate electrode and the compound semiconductor layer; and
a dielectric layer covering and exposing a part of the compound semiconductor layer, wherein the stack of dielectric layers covers the dielectric layer,
wherein the stack of dielectric layers comprises at least two layers having different etching rates,
wherein the stack of dielectric layers is in direct contact with the first side of the gate electrode, and the stack of dielectric layers is formed before a source electrode and a drain electrode,
wherein the source electrode is formed as one piece made by a same material extending from a top of the stack of dielectric layers to the barrier layer and in contact with the channel layer; and
wherein the drain electrode is formed as one piece made by a same material extending from the top of the stack of dielectric layers to the barrier layer and in contact with the channel layer.

2. The semiconductor structure as claimed in claim 1, wherein a ratio of the etching rates of the at least two layers is 1.1 to 8.0 in a wet etching solution.

3. The semiconductor structure as claimed in claim 1, wherein the stack of dielectric layers comprises:
a main layer disposed on the gate electrode; and
a capping layer disposed on the main layer,
wherein an etching rate of the capping layer is lower than an etching rate of the main layer.

4. The semiconductor structure as claimed in claim 3, wherein a ratio of a thickness of the main layer to a thickness of the capping layer is 1:1-60:1.

5. The semiconductor structure as claimed in claim 1, wherein the stack of dielectric layers comprises:
a bottom layer disposed on the gate electrode; and
a main layer disposed on the bottom layer,
wherein an etching rate of the bottom layer is lower than an etching rate of the main layer.

6. The semiconductor structure as claimed in claim 5, wherein a ratio of a thickness of the bottom layer to a thickness of the main layer is 1:1-1:60.

7. The semiconductor structure as claimed in claim 1, wherein the stack of dielectric layers comprises:
a bottom layer disposed on the gate electrode;
a main layer disposed on the bottom layer; and
a capping layer disposed on the main layer,
wherein an etching rate of the bottom layer is lower than an etching rate of the main layer, and an etching rate of the capping layer is lower than the etching rate of the main layer.

8. The semiconductor structure as claimed in claim 7, wherein a ratio of a thickness of the bottom layer to a thickness of the main layer, and to a thickness of the capping layer is 1:24:1-1:60:1.

9. The semiconductor structure as claimed in claim 1, wherein the stack of dielectric layers comprises oxide, nitride, oxynitride or a combination thereof.

10. The semiconductor structure as claimed in claim 1, wherein the stack of dielectric layers comprises aluminum oxide.

11. The semiconductor structure as claimed in claim 1, wherein the at least two layers comprise the same compound.

12. The semiconductor structure as claimed in claim 1, wherein a thickness of the stack of dielectric layers is 2400 Å-3000 Å.

13. The semiconductor structure as claimed in claim 1, further comprising:
a buffer layer disposed on the substrate, wherein the buffer layer is disposed between the channel layer and the substrate.

14. The semiconductor structure as claimed in claim 1, further comprising:
a metal nitride layer disposed between the compound semiconductor layer and the gate electrode,
wherein a dielectric layer is disposed on the metal nitride layer, the gate electrode is disposed on the metal nitride layer, and the metal nitride layer, the dielectric layer, and the stack of dielectric layers enclose the gate electrode.

15. The semiconductor structure as claimed in claim 1, wherein the dielectric layer is another stack of dielectric layers comprising at least two layers having different etching rates.

16. The semiconductor structure as claimed in claim 1, further comprising:
   another stack of dielectric layers disposed on the stack of dielectric layers and comprising at least two layers having different etching rates.

17. The semiconductor structure as claimed in claim 1, wherein the at least two layers are formed from different precursors.

\* \* \* \* \*